United States Patent [19]

Ushifusa et al.

[11] Patent Number: 4,598,167
[45] Date of Patent: Jul. 1, 1986

[54] MULTILAYERED CERAMIC CIRCUIT BOARD

[75] Inventors: Nobuyuki Ushifusa; Satoru Ogihara, both of Hitachi; Takanobu Noro, Yokohama, all of Japan

[73] Assignee: Hitachi, Ltd., Tokyo, Japan

[21] Appl. No.: 634,066

[22] Filed: Jul. 25, 1984

[30] Foreign Application Priority Data

Jul. 27, 1983 [JP] Japan ................. 58-135882

[51] Int. Cl.$^4$ .............................................. H05K 1/00
[52] U.S. Cl. ................... 174/68.5; 252/514; 501/66; 501/77
[58] Field of Search ............. 174/68.5; 501/32, 66, 501/77; 252/514

[56] References Cited

U.S. PATENT DOCUMENTS

| | | | |
|---|---|---|---|
| 3,762,936 | 10/1973 | Iler | 106/54 |
| 3,843,376 | 10/1974 | Cornelissen et al. | 501/66 X |
| 3,922,777 | 12/1975 | Weitze et al. | 174/68.5 X |
| 4,072,771 | 2/1978 | Grier, Sr. | 174/68.5 X |
| 4,098,949 | 7/1978 | Kosiorek | 252/514 X |
| 4,109,377 | 8/1978 | Blazick et al. | 174/68.5 X |
| 4,133,690 | 1/1979 | Muller | 106/52 |
| 4,256,796 | 3/1981 | Hang et al. | 174/68.5 |
| 4,299,873 | 11/1981 | Ogihara et al. | 428/137 |
| 4,301,324 | 11/1981 | Kumar et al. | 174/68.5 |
| 4,313,026 | 1/1982 | Yamada et al. | 361/414 X |
| 4,355,114 | 10/1982 | Hang et al. | 501/77 X |
| 4,369,220 | 1/1983 | Prabhu et al. | 174/68.5 X |
| 4,400,214 | 8/1983 | Ogawa et al. | 252/514 X |
| 4,415,624 | 11/1983 | Prabhu et al. | 338/308 X |
| 4,424,251 | 1/1984 | Sugishita et al. | 428/209 |

OTHER PUBLICATIONS

Wild, R. N.; Crack Resistant Plated Through-Holes for Multilayer Interconnection Boards; IBM Technical Disclosure Bulletin; vol. 15, No. 5; Oct. 1972.

*Primary Examiner*—Arthur T. Grimley
*Assistant Examiner*—Morris H. Nimmo
*Attorney, Agent, or Firm*—Antonelli, Terry & Wands

[57] ABSTRACT

A multilayered ceramic circuit board, formed by sintering together a plurality of unit ceramic circuit boards, wherein each unit ceramic circuit board includes a ceramic layer, a patterned electrically conductive layer and through hole conductors formed in the ceramic layer for connecting the patterned electrically conductive layers of the respective unit ceramic circuit boards to form a predetermined wiring circuit. The patterned electrically conductive layers and the through hole conductors have a coefficient of thermal expansion which is greater than the coefficient of thermal expansion of the ceramic layers, wherein the difference between the coefficients of thermal expansion is selected to be less than $100 \times 10^{-7}/°C.$, and the through holes have decreased pitch. The conductive layers and conductors can be formed of a metal such as gold, silver or copper, with a low softening point glass filler to reduce the coefficient of thermal expansion of the conductive layers and conductors.

The multilayered ceramic circuit board according to the present invention is less sensitive to cracks due to thermal stress.

12 Claims, 2 Drawing Figures

MULTILAYERED CERAMIC CIRCUIT BOARD

FIELD OF THE INVENTION

The present invention relates to a multilayered ceramic circuit board which comprises a ceramic material with a low dielectric constant and a coefficient of thermal expansion of 30 to $70 \times 10^{-7}/°C.$, and an electrically conductive layer having a low resistivity. In particular, the invention relates to a multilayered printed ceramic circuit board on which LSIs can be directly mounted.

BACKGROUND OF THE INVENTION

Ceramic circuit boards are often used for the mounting of semiconductor elements, in line with the trend toward constructing electronic circuits in a highly integrated form. Alumina porcelain has hitherto been chosen for the products of ceramic boards, in view of its thermal conductivity, mechanical strength and electrical insulation.

However, alumina ceramic materials have a dielectric constant of as large as about 9, which means that signal transmission within electronic circuits is delayed, which is a disadvantage when transmitting signals at high speeds. Alumina ceramic materials are fired sintered at temperatures of as high as 1500° to 1650° C., and only metal materials of a high melting point, such as tungsten, molybdenum or the like, can be used for forming wiring circuits simultaneously with the sintering of the ceramic material. Tungsten and molybdenum are materials that are difficult to sinter, and exhibit electrical resistances of as much as 5.2 and 5.5 microohms·cm at room temperature. When the wiring circuit is required to be formed at a high density, the width of the wiring circuit must be reduced, so that the electrical resistance thereof per unit length increases. Accordingly, the signal transmission speed is reduced by the increased voltage drop.

Thus, multilayered ceramic circuit boards made of conventional alumina ceramic material have a high dielectric constant and the metal material for the wiring has a relatively large resistivity; so that such conventional circuit boards cannot be advantageously employed in electronic computers that operate at high speeds.

The co-pending U.S. application, assigned to the same assignee as that of this application, Ser. No. 511,903, filed July 8, 1983, "Ceramic Multi-layer Circuit Board" discloses ceramic materials with low dielectric constants and low sintering temperatures, and electrically conductive materials with low resistivities, such as silver, copper and gold.

SUMMARY OF THE INVENTION

The present invention is to a multilayered ceramic circuit board that comprises a plurality of ceramic layers integrally bonded, each having a patterned electrically conductive layer supported thereon and through holes filled with electrical conductors for connecting the patterned electrically conductive layers on respective ceramic layers to form a predetermined wiring circuit.

An object of the present invention is to prevent the development of cracks at the boundaries of the through holes in the ceramic layers of the multilayered ceramic circuit board.

The present invention provides a multilayered ceramic circuit board formed of a plurality of ceramic layers integrally bonded, each ceramic layer having a patterned electrically conductive layer supported thereon and through holes filled with electrical conductors for connecting the patterned electrically conductive layers to form a predetermined wiring circuit, wherein an electrically conductive material for the patterned electrically conductive layers and for the electrical conductors for the through holes has a coefficient of thermal expansion larger than the coefficient of thermal expansion of a ceramic material for the ceramic layers, and further the difference between the coefficients of the both materials is selected to be less than $100 \times 10^{-7}/°C.$ The present invention further provides a multilayered ceramic circuit board formed of a plurality of ceramic layers integrally bonded, each ceramic layer having a patterned electrically conductive layer supported thereon and through holes filled with electrical conductors for connecting the patterned electrically conductive layers to form a predetermined wiring circuit, wherein an electrically conductive material for the patterned electrically conductive layers and for the electrical conductors for the through holes has a coefficient of thermal expansion larger than the coefficient of thermal expansion of a ceramic material for the ceramic layers, and further the pitch of the through holes (that is, the center-to-center distance between adjacent through holes) in the ceramic layers is selected to be less than 0.5 mm.

The electrically conductive material for the wiring circuit conductor preferably has a small resistivity and also a coefficient of thermal expansion such that cracks do not develop at the boundaries of the through holes in the ceramic layers.

Known examples of the electrically conductive materials with an excellent electrical conductivity include silver (1.6 microohms·cm), copper (1.7 microohms·cm) and gold (2.2 microohms·cm). These materials melt at 961° C., 1083° C., and 1063° C., respectively. To use these materials for the wiring circuit conductors on a multilayered ceramic circuit board, it is necessary to select a ceramic material that is sintered at a temperature lower than these melting points. If sintered at a temperature higher than the melting point of the electrically conductive material, the wiring circuit conductors formed on and through the ceramic layers by a printing method would melt, which would result in line breakages or short circuits.

Silver, copper and gold have small resistivities, but have coefficients of thermal expansion of as much as $193 \times 10^{-7}/°C.$, $173 \times 10^{-7}/°C.$, and $150 \times 10^{-7}/°C.$, respectively.

To mount LSI chips directly on the multilayered ceramic circuit board, the coefficient of thermal expansion of the ceramic material had better not differ much from the coefficient of thermal expansion ($35 \times 10^{-7}/°C.$) of silicon, so that reliability of the connection portions is not lost. It is therefore desired that the ceramic material have a coefficient of thermal expansion which is less than the coefficient of thermal expansion (about $70 \times 10^{-7}/°C.$) of alumina which is currently used in practice. On the other hand, if the ceramic material has a coefficient of thermal expansion which is less than $70 \times 10^{-7}/°C.$, the difference between it and the coefficient of thermal expansion of silver, copper or gold increases, and cracks may develop at the boundaries of the through holes in the ceramic layers.

When tungsten or molybdenum (with a coefficient of thermal expansion of $4.5 \times 10^{-7}/°C$ or $5.4 \times 10^{-7}/°C$) is used as an electrically conductive material with the alumina ceramic material that is used conventionally and which has a coefficient of thermal expansion of $70 \times 10^{-7}/°C$, a reduction in the pitch of the through holes results in cracks between the through holes. Therefore, it is not possible to reduce the pitch of the through holes. Cracks do not develop when the through holes have a diameter of 0.2 mm and a pitch of more than 0.8 mm. This means that there is a limitation imposed on the density of the wiring circuits when an electrically conductive material such as tungsten or molybdenum which has a small coefficient of thermal expansion is used with an alumina ceramic material.

However, when the electrically conductive material containing silver, copper or gold, and the ceramic material having a coefficient of thermal expansion of less than $70 \times 10^{-7}/°C$, are used for the multilayered ceramic circuit boards as mentioned previously, arcuate cracks may develop at the boundaries of the through holes in the ceramic layers when the through holes are formed having a diameter of 0.1 mm and a pitch of more than 0.5 mm. In contrast with the use of an alumina ceramic material and tungsten, or an alumina ceramic material and molybdenum, it has, however, been discovered that no cracks develop in the present invention when the pitch of the through holes is reduced to less than 0.5 mm.

If the ceramic material has a coefficient of thermal expansion of less than $70 \times 10^{-7}/°C$, the difference between the coefficient of thermal expansion of the ceramic material and the coefficient of thermal expansion of the electrically conductive material could exceed $100 \times 10^{-7}/°C$. In this case, cracks may develop to some extent at the boundaries of the through holes in the ceramic layers. It has, however, been found that no cracks develop when the difference between the coefficients of thermal expansion of the ceramic material and the electrically conductive material is less than $100 \times 10^{-7}/°C$.

Thermal stresses caused by differences in coefficients of thermal expansion were analyzed by a finite element method, using a system in which through holes were provided in a ceramic material at equal distances. It was found that when the coefficient of thermal expansion of the ceramic material is less than the coefficient of the thermal expansion of the electrically conductive material, tensile stresses are exerted in the radial direction from the centers of the through holes, and compressive stresses are exerted in the circumferential direction thereof. It is known that ceramic materials are generally strong against compressive stresses but are weak against tensile stresses. In this case, the stresses act to separate the boundaries between the through holes and the ceramic material. In this case, it has also been confirmed that if the pitch of the through holes is reduced, the thermal stresses (tensile stresses) separating the through holes from the ceramic material are reduced.

Conversely, when the coefficient of thermal expansion of the ceramic material is larger than the coefficient of thermal expansion of the electrically conductive material, e.g., when tungsten or molybdenum is used as electrically conductive material with an alumina ceramic material, compressive stresses are exerted in the radial direction and tensile stresses are exerted in the circumferential direction, viewed from the centers of the through holes. That is, cracks propagate between the through holes. It was confirmed that if the pitch of the through holes is reduced, the tensile stresses increase in the circumferential direction, and cracks develop easily between the through holes.

The results of the stress analysis also indicate that the pitch of the through holes should be reduced when the coefficient of thermal expansion of the ceramic material is less than that of the electrically conductive material. That is, by forming the wiring circuit in the multilayered ceramic circuit board at a high density, the generation of thermal stresses are reduced and the development of cracks are restrained.

In other words, it is possible to reduce the pitch of the through holes in order to prevent the occurrence of cracks at the boundaries of the through holes in the ceramic layers, when using silver, copper or gold, which have small resistivities but large coefficients of thermal expansion, as an electrically conductive material.

It was also confirmed that if the coefficient of thermal expansion of the electrically conductive material is reduced, the thermal stresses (tensile stresses) separating the through holes from the ceramic material are reduced.

The ceramic materials for the ceramic layers of the present invention are essentially composed of a low temperature softening glass, with a softening point of 600° C. to 850° C., and silicon dioxide (silica), and have a dielectric constant of less than 5.7 and a coefficient of thermal expansion of between 30 to $70 \times 10^{-7}/°C$.

The electrically conductive materials for the patterned electrically conductive layers and the electrical conductors for the through holes of the present invention are composed chiefly of a metal which has a low resistivity, such as silver, copper, gold, their alloys and mixture thereof, and the electrically conductive materials may also contain a filler which has a small coefficient of thermal expansion such as low temperature softening glasses and silicon dioxide (silica), in order to reduce the coefficient of thermal expansion of the electrically conductive materials.

The low temperature softening glass composition in the electrically conductive material consists essentially of $SiO_2$ in an amount of 5 to 90% by weight, $B_2O_3$ in an amount of 10 to 70% by weight and a refractory additive in an amount of 1 to 55% by weight.

The low temperature softening glass composition in the electrically conductive material preferably consists essentially of $SiO_2$ in an amount of 10 to 80%, $B_2O_3$ in an amount of 15 to 65%, $Al_2O_3$ in an amount of 3 to 27%, up to 15% of MgO, up to b 35% of BaO, up to 45% of $AlPO_4$, up to 18% of $MgF_2$, up to 10% of $K_2O$, up to 5% of $Na_2O$, and up to 17% of $Bi_2O_3$.

The low temperature softening glass composition in the electrically conductive material more preferably consists essentially of $SiO_2$ in an amount of 30 to 50%, $B_2O_3$ in an amount of 20 to 50%, $Al_2O_3$ in an amount of 5 to 15%, up to 10% of MgO, up to 20% of BaO, up to 30% of $AlPO_4$, up to 10% of $MgF_2$, up to 10% of $K_2O$, up to 5% of $Na_2O$, and up to 10% of $Bi_2O_3$.

The low temperature softening glass composition in the electrically conductive material may alternatively consist essentially of 30 to 50% of $SiO_2$, 10 to 40% of $B_2O_3$, 5 to 15% of $Al_2O_3$, 2 to 10% of at least one of BaO and MgO, and up to 5% of at least one of $Na_2O$ and $K_2O$.

The low temperature softening glass composition in the electrically conductive material may be the same glass composition as that for the ceramic layers.

The silicon dioxide (silica) in the electrically conductive material is a member selected from the group consisting of quartz, quartz glass, cristobalite, tridymite and mixtures thereof and has a linear thermal expansion coefficient of less than $100 \times 10^{-7}/°C$. over the temperature range of 25° to 850° C.

DETAILED DESCRIPTION OF THE INVENTION

Figure 1:
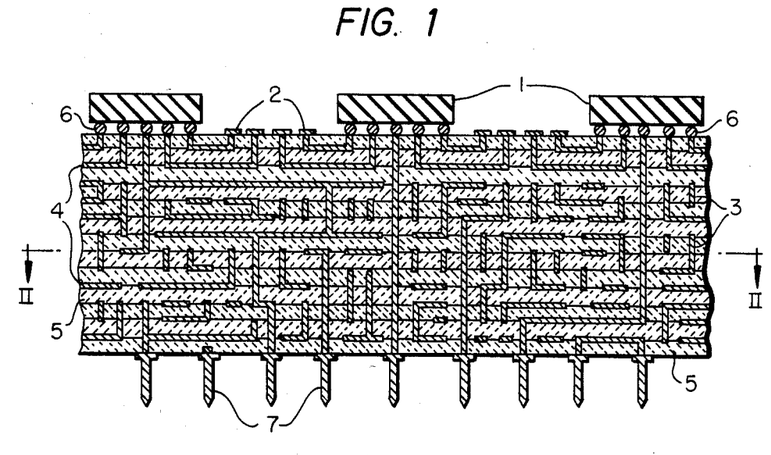
FIG. 1 is a vertical section through a multilayered ceramic circuit board.
Figure 2:
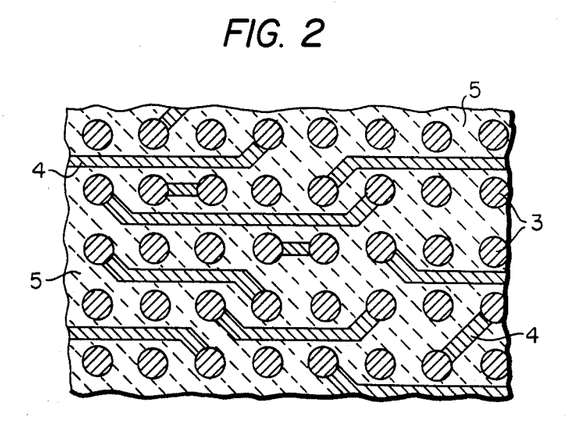
FIG. 2 is a sectional view taken along the line II—II of FIG. 1.

FIGS. 1 and 2 show one form of multilayered ceramic circuit boards to which the present invention is applied. A multilayered ceramic circuit board is formed by sintering together a plurality of unit ceramic circuit boards. The unit ceramic circuit board includes a ceramic layer 5, a patterned electrically conductive layer 4 supported on the ceramic layer, and electrical conductors 3 filled in through holes formed in the ceramic layer 5 for connecting the patterned electrically conductive layers of the respective unit ceramic circuit boards to form a predetermined wiring circuit. At the top face of the multilayered ceramic circuit board, LSI chips 1 are mounted and connected to the wiring circuit through controlled collapse bonding solder 6, and a surface patterned electrically conductive layer 2 is formed, and at the bottom face, there are provided pin terminals 7.

Working examples of the present invention will be described below. In these examples, all parts and percentages are based on weights.

The compositions of low-temperature softening glasses which are used as one of starting materials for the ceramic material of the present invention and their properties, are shown in Table 1.

Table 2 shows samples and their results of Examples 1 and 2 on various ceramic materials combined with silver or copper as the electrically conductive material while changing the pitch of the through holes.

Table 3 shows various ceramic materials used for Examples 3, 4, 5 and 6 and their properties.

Tables 4, 5, 6 and 7 respectively show samples and their results of Examples 3, 4, 5 and 6.

TABLE 1

Composition and Properties of Low-Temperature Softening Glass

| No. | $SiO_2$ | $Al_2O_3$ | MgO | BaO | $B_2O_3$ | $AlPO_4$ | $MgF_2$ | $K_2O$ | $Na_2O$ | $Bi_2O_3$ | Softening point (°C.) | Dielectric constant (at 1 MHz) |
|---|---|---|---|---|---|---|---|---|---|---|---|---|
| 1 | 40–50 | 20–25 | 10–15 | — | 5–15 | — | — | — | — | 5–15 | 900–1000 | 5.0–6.0 |
| 2 | 20–30 | 15–20 | 5–10 | — | 30–50 | — | — | — | — | 5–15 | 700–800 | 4.5–5.5 |
| 3 | 20–30 | 15–20 | 5–10 | — | 40–60 | — | — | — | — | — | 700–800 | 4.0–5.0 |
| 4 | 15–30 | 10–20 | — | 20–25 | 30–50 | — | — | — | — | — | 650–740 | 4.8–5.5 |
| 5 | 20–30 | 15–23 | — | 25–30 | 20–30 | — | — | — | — | — | 750–700 | 5.0–5.7 |
| 6 | 35–50 | 5–15 | — | 7.5–15 | 25–40 | — | — | 0–0.1 | 0–0.1 | — | 700–800 | 4.1–4.5 |
| 7 | 40–60 | 5–15 | — | 5–15 | 20–30 | — | — | 1–4.5 | 1–4.5 | — | 650–750 | 4.5–5.3 |
| 8 | 20–40 | — | — | — | 20–40 | 20–40 | 5–15 | — | — | — | 650–750 | 4.0–5.0 |
| 9 | 60–80 | 0–2 | — | — | 20–30 | — | — | 1–3 | 1–3 | — | 700–800 | 4.0–5.0 |
| 10 | 30–50 | — | — | — | 20–40 | 20–40 | — | — | — | — | 730–820 | 4.0–5.0 |
| 11 | 30–50 | 15–20 | 5–10 | — | 30–50 | — | — | — | — | — | 700–800 | 4.0–5.0 |
| 12 | 35–45 | 5–15 | 2.5–7.5 | — | 30–50 | — | — | 1.5–5 | — | — | 650–750 | 4.6–5.0 |
| 13 | 30–50 | 5–10 | 5–10 | 5–10 | 30–50 | — | — | 2–7 | — | — | 650–750 | 4.3–5.0 |

TABLE 2

Composition of a Mixture of Low-Temperature Softening Glass and a $SiO_2$ Additive, Sintering Temperature of the Mixture, Through Hole Pitches and Presence of Cracks in the Sintered Mixture

| | Low-temperature softening glass | | Silicon Dioxide | | | | Sintering temperature | Pitch of through | Presence |
| No. | Glass No. | Quantity | Name | Quantity | Name | Quantity | (°C.) | holes (mm) | of cracks |
|---|---|---|---|---|---|---|---|---|---|
| 14 | 2 | 60 | Quartz | 40 | — | — | 800 | 0.25 | no |
| 15 | " | " | Cristobalite | " | — | — | " | 0.25 | " |
| 16 | " | " | Tridymite | " | — | — | " | 0.3 | " |
| 17 | " | " | Quartz glass | 35 | Quartz | 5 | " | 0.6 | yes |
| 18 | " | " | " | 30 | " | 10 | " | 0.6 | " |
| 19 | " | " | " | 20 | Cristobalite | 20 | " | 0.5 | no |
| 20 | " | " | " | 10 | " | 30 | " | 0.5 | " |
| 21 | " | " | " | 5 | " | 35 | " | 0.5 | " |
| 22 | " | 40 | Quartz | 30 | " | 30 | " | 0.25 | " |
| 23 | " | " | " | 10 | " | 50 | " | 0.25 | " |
| 24 | " | 60 | Cristobalite | 20 | Tridymite | 20 | " | 0.3 | " |
| 25 | " | " | Quartz glass | 10 | " | 30 | " | 0.4 | " |
| 26 | " | " | " | 20 | " | 20 | " | 0.5 | " |
| 27 | 4 | " | Quartz | 40 | — | — | " | 0.25 | " |
| 28 | " | " | Cristobalite | 40 | — | — | " | 0.25 | " |
| 29 | " | " | Tridymite | " | — | — | " | 0.25 | " |
| 30 | " | " | Quartz glass | 35 | Quartz | 5 | " | 2.0 | yes |
| 31 | " | " | " | 30 | " | 10 | " | 1.0 | " |
| 32 | " | " | " | 20 | " | 20 | " | 0.5 | no |
| 33 | " | " | " | 10 | " | 30 | " | 0.4 | " |
| 34 | " | " | " | 5 | " | 35 | " | 0.3 | " |

TABLE 2-continued

Composition of a Mixture of Low-Temperature Softening Glass and a SiO2 Additive, Sintering Temperature of the Mixture, Through Hole Pitches and Presence of Cracks in the Sintered Mixture

| | Mixture ratio (% by weight) | | | | | | Sintering temperature (°C.) | Pitch of through holes (mm) | Presence of cracks |
|---|---|---|---|---|---|---|---|---|---|
| | Low-temperature softening glass | | Silicon Dioxide | | | | | | |
| No. | Glass No. | Quantity | Name | Quantity | Name | Quantity | | | |
| 35 | " | 40 | " | 30 | " | 30 | 900 | 0.4 | " |
| 36 | " | " | " | 10 | " | 50 | " | 0.2 | " |
| 37 | 5 | 60 | Quartz | 40 | — | — | 850 | 0.25 | " |
| 38 | " | " | Cristobalite | " | — | — | " | 0.25 | " |
| 39 | " | " | Tridymite | " | — | — | " | 0.3 | " |
| 40 | " | " | Quartz glass | 10 | Cristobalite | 30 | " | 0.4 | " |
| 41 | " | " | " | 20 | " | 20 | " | 0.5 | " |
| 42 | " | " | " | 20 | Tridymite | 20 | " | 0.5 | " |
| 43 | " | " | Quartz | 20 | Cristobalite | 20 | " | 0.25 | " |
| 44 | " | " | " | 20 | Tridymite | 20 | " | 0.25 | " |
| 45 | " | " | Cristobalite | 20 | " | 20 | " | 0.3 | " |
| 46 | 7 | " | Quartz | 40 | — | — | 800 | 0.25 | " |
| 47 | " | " | Cristobalite | " | — | — | " | 0.25 | " |
| 48 | " | " | Tridymite | " | — | — | " | 0.3 | " |
| 49 | " | " | Quartz glass | 35 | Quartz | 5 | " | 1.5 | yes |
| 50 | " | " | " | 30 | " | 10 | " | 1.5 | " |
| 51 | " | " | " | 20 | " | 20 | " | 1.5 | " |
| 52 | " | " | " | 10 | " | 30 | " | 1.0 | " |
| 53 | " | " | " | 5 | " | 35 | " | 1.0 | " |
| 54 | " | 50 | " | 30 | " | 20 | 850 | 0.5 | no |
| 55 | " | " | " | 20 | " | 30 | " | 0.4 | " |
| 56 | " | " | " | 10 | " | 40 | 800 | 0.25 | " |
| 57 | " | 70 | " | 15 | " | 15 | " | 0.5 | " |
| 58 | " | 80 | " | 10 | " | 10 | " | 0.6 | yes |
| 59 | " | 90 | " | 5 | " | 5 | " | 0.8 | " |
| 60 | " | 50 | " | " | " | 45 | " | 0.2 | no |
| 61 | " | 40 | " | " | " | 55 | 850 | 0.2 | " |
| 62 | " | 30 | " | " | Cristobalite | 65 | 900 | 0.25 | " |
| 63 | 12 | 40 | Quartz glass | 50 | Quartz | 10 | 850 | 2.0 | yes |
| 64 | " | " | " | 40 | " | 20 | " | 0.8 | " |
| 65 | " | " | " | 30 | " | 30 | " | 0.4 | no |
| 66 | " | " | " | 20 | " | 40 | " | 0.25 | " |
| 67 | " | " | " | 10 | " | 50 | " | 0.2 | " |
| 68 | " | 60 | " | 20 | " | 20 | 800 | 0.4 | " |
| 69 | " | 80 | " | 5 | " | 15 | " | 0.4 | " |
| 70 | " | 90 | " | 5 | " | 5 | " | 0.4 | " |
| 71 | " | 60 | " | 20 | Cristobalite | 20 | " | 0.5 | " |
| 72 | " | " | " | 10 | " | 30 | " | 0.4 | " |
| 73 | " | " | Quartz | 40 | — | — | " | 0.25 | " |
| 74 | " | " | Cristobalite | " | — | — | " | 0.25 | " |
| 75 | " | " | Tridymite | " | — | — | " | 0.25 | " |
| 76 | " | 50 | Quartz | 45 | Cristobalite | 5 | 850 | 0.2 | " |
| 77 | " | " | Cristobalite | 25 | Tridymite | 25 | " | 0.3 | " |

TABLE 3

Coefficient of Thermal Expansion of Sintered Mixture of Low-Temperature Softening Glass and a SiO2 Additive

| | Mixture ratio (% by weight) | | | | | | Sintering temperature (°C.) | Coefficient of thermal expansion ($10^{-7}$/°C.) |
|---|---|---|---|---|---|---|---|---|
| | Low-temperature softening glass | | Silicon Dioxide | | | | | |
| No. | Glass No. | Quantity | Name | Quantity | Name | Quantity | | |
| 78 | 2 | 60 | Quartz glass | 10 | Tridymite | 30 | 800 | 60 |
| 79 | " | " | " | 20 | " | 20 | " | 52 |
| 80 | " | " | " | 20 | Cristobalite | 20 | " | 50 |
| 81 | " | " | " | 10 | " | 30 | " | 61 |
| 82 | " | " | Quartz | 40 | — | — | " | 66 |
| 83 | " | " | Cristobalite | " | — | — | " | 67 |
| 84 | " | " | Tridymite | " | — | — | " | 65 |
| 85 | 4 | " | Quartz glass | 35 | Quartz | 5 | " | 32 |
| 86 | " | " | " | 30 | " | 10 | " | 40 |
| 87 | " | " | " | 20 | " | 20 | " | 55 |
| 88 | " | " | " | 10 | " | 30 | " | 70 |
| 89 | " | 40 | " | 30 | " | 30 | 900 | 63 |
| 90 | " | 70 | Quartz | 30 | — | — | 850 | 65 |
| 91 | " | " | Cristobalite | " | — | — | " | 66 |
| 92 | " | " | Tridymite | " | — | — | " | 64 |
| 93 | 5 | 60 | Quartz glass | 10 | Cristobalite | 30 | " | 60 |
| 94 | " | " | " | 20 | " | 20 | " | 52 |
| 95 | " | " | " | 20 | Tridymite | 20 | " | 51 |
| 96 | " | " | Quartz | 40 | — | — | " | 66 |
| 97 | " | " | Cristobalite | " | — | — | " | 67 |
| 98 | " | " | Tridymite | " | — | — | " | 65 |

TABLE 3-continued

Coefficient of Thermal Expansion of Sintered Mixture of Low-Temperature Softening Glass and a SiO$_2$ Additive

| | Mixture ratio (% by weight) | | | | | | Sintering temperature (°C.) | Coefficient of thermal expansion (10$^{-7}$/°C.) |
|---|---|---|---|---|---|---|---|---|
| | Low-temperature softening glass | | Silicon Dioxide | | | | | |
| No. | Glass No. | Quantity | Name | Quantity | Name | Quantity | | |
| 99 | 7 | 70 | Quartz | 30 | — | — | " | 69 |
| 100 | " | " | Cristobalite | " | — | — | " | 70 |
| 101 | " | " | Tridymite | " | — | — | " | 68 |
| 102 | 12 | 60 | Quartz glass | 20 | Cristobalite | 20 | 800 | 53 |
| 103 | " | " | " | 10 | " | 30 | " | 63 |
| 104 | " | " | " | 20 | Quartz | 20 | " | 60 |
| 105 | " | " | Quartz | 40 | — | — | " | 64 |
| 106 | " | " | Cristobalite | " | — | — | " | 65 |
| 107 | " | " | Tridymite | " | — | — | " | 63 |
| 108 | " | 40 | Quartz glass | 40 | Quartz | 20 | 850 | 45 |

TABLE 4

Sintering Temperature of a Mixture of Electrically Conductive Material Consisting of Silver and a SiO$_2$ Additive and Presence of Cracks in the Sintered Mixture

| | Ceramic material No. | Electrically conductive material | | | Coefficient of thermal expansion (10$^{-7}$/°C.) | Sintering temperature (°C.) | Presence of cracks |
|---|---|---|---|---|---|---|---|
| | | Blending ratio (% by weight) | | | | | |
| No. | | Quantity of silver | Name | Quantity | | | |
| 109 | 78 | 80 | Quartz glass | 20 | 165 | 800 | yes |
| 110 | " | 75 | " | 25 | 157 | " | no |
| 111 | " | 70 | " | 30 | 150 | " | " |
| 112 | " | 80 | Spodumene | 20 | 154 | " | " |
| 113 | " | 70 | Alumina | 30 | 156 | " | " |
| 114 | 82 | 80 | Quartz glass | 20 | 165 | " | " |
| 115 | " | 85 | Spodumene | 15 | 164 | " | " |
| 116 | " | 90 | β-Eucryptite | 10 | 170 | " | yes |
| 117 | " | 80 | " | 20 | 150 | " | no |
| 118 | 86 | 60 | Quartz glass | 40 | 136 | " | " |
| 119 | " | 70 | " | 30 | 150 | " | yes |
| 120 | " | 70 | Spodumene | 30 | 135 | " | no |
| 121 | 92 | 30 | Gold | 70 | 163 | 850 | " |
| 122 | " | 80 | Quartz glass | 20 | 165 | " | yes |
| 123 | " | 75 | " | 25 | 157 | " | no |
| 124 | " | 80 | β-Eucryptite | 20 | 150 | " | " |
| 125 | " | 80 | Petalite | 20 | 152 | " | " |
| 126 | 96 | 80 | Quartz glass | 20 | 165 | " | " |
| 127 | " | 85 | Petalite | 15 | 162 | " | " |
| 128 | " | 90 | β-Eucryptite | 10 | 170 | " | yes |
| 129 | 100 | 40 | Gold | 60 | 167 | " | no |
| 130 | " | 80 | Quartz glass | 20 | 165 | " | " |
| 131 | " | 90 | " | 10 | 179 | " | yes |
| 132 | 105 | 85 | Spodumene | 15 | 164 | 800 | no |
| 133 | " | 80 | Quartz glass | 20 | 165 | " | yes |
| 134 | " | 75 | " | 25 | 157 | " | no |
| 135 | " | 70 | Alumina | 30 | 156 | " | " |
| 136 | 108 | 70 | Spodumene | 30 | 135 | 850 | " |
| 137 | " | 60 | Quartz glass | 40 | 136 | " | " |
| 138 | " | 70 | " | 30 | 150 | " | yes |
| 139 | " | 60 | Alumina | 40 | 142 | " | no |

TABLE 5

Sintering Temperature of a Mixture of Copper and a Low-Temperature Softening Glass and a SiO$_2$ Additive and Presence of Cracks in the Sintered Mixture

| | Ceramic material No. | Electrically conductive material | | | Coefficient of thermal expansion (10$^{-7}$/°C.) | Sintering temperature (°C.) | Presence of cracks |
|---|---|---|---|---|---|---|---|
| | | Blending ratio (% by weight) | | | | | |
| No. | | Quantity of copper | Name | Quantity | | | |
| 140 | 78 | 90 | Quartz glass | 10 | 162 | 800 | yes |
| 141 | " | 80 | " | 20 | 149 | " | no |
| 142 | " | 75 | " | 25 | 142 | " | " |
| 143 | " | 85 | Spodumene | 15 | 147 | " | " |
| 144 | " | 80 | Alumina | 20 | 151 | " | " |
| 145 | 82 | 90 | Quartz glass | 10 | 162 | " | " |
| 146 | " | 90 | Spodumene | 10 | 156 | " | " |
| 147 | " | 95 | β-Eucryptite | 5 | 161 | " | " |
| 148 | " | 85 | Alumina | 15 | 157 | " | " |
| 149 | 86 | 80 | Quartz glass | 20 | 149 | " | yes |
| 150 | " | 70 | " | 30 | 136 | " | no |
| 151 | " | 80 | Spodumene | 20 | 138 | " | " |
| 152 | 92 | 90 | " | 10 | 156 | 850 | " |

TABLE 5-continued

Sintering Temperature of a Mixture of Copper and a Low-Temperature Softening Glass and a SiO₂ Additive and Presence of Cracks in the Sintered Mixture

| | Ceramic material No. | Electrically conductive material | | | Coefficient of thermal expansion ($10^{-7}$/°C.) | Sintering temperature (°C.) | Presence of cracks |
|---|---|---|---|---|---|---|---|
| | | Blending ratio (% by weight) | | | | | |
| No. | | Quantity of copper | Name | Quantity | | | |
| 153 | " | 90 | Quartz glass | 10 | 162 | " | " |
| 154 | " | 95 | " | 5 | 167 | " | yes |
| 155 | " | 85 | Alumina | 15 | 157 | " | no |
| 156 | " | 95 | Petalite | 5 | 163 | " | " |
| 157 | 96 | 90 | Quartz glass | 10 | 162 | " | " |
| 158 | " | 95 | Spodumene | 5 | 164 | " | " |
| 159 | " | 95 | β-Eucryptite | 5 | 161 | " | " |
| 160 | 100 | " | " | " | " | " | " |
| 161 | " | 90 | Alumina | 10 | 162 | " | " |
| 162 | " | 80 | Gold | 20 | 168 | " | " |
| 163 | 105 | 95 | Spodumene | 5 | 164 | 800 | " |
| 164 | " | 90 | Quartz glass | 10 | 162 | " | " |
| 165 | " | 95 | Alumina | 5 | 168 | " | yes |
| 166 | " | 90 | " | 10 | 162 | " | no |
| 167 | 108 | 85 | Spodumene | 15 | 147 | 850 | yes |
| 168 | " | 75 | Quartz glass | 25 | 142 | " | no |
| 169 | " | 70 | Alumina | 30 | 141 | " | " |
| 170 | " | 80 | β-Eucryptite | 20 | 136 | " | " |

TABLE 6

Compositions of Conductive Materials Consisting of Silver and Low-Temperature Softening Glass

| No. | Ceramic material No. | Electrically conductive material | | | Coefficient of thermal expansion ($10^{-7}$/°C.) | Sintering temperature (°C.) | Presence of cracks |
|---|---|---|---|---|---|---|---|
| | | Blending ratio (% by weight) | | | | | |
| | | Quantity of silver | Low-temperature softening glass No. | Quantity | | | |
| 171 | 78 | 80 | 2 | 20 | 164 | 800 | yes |
| 172 | " | 70 | " | 30 | 150 | " | no |
| 173 | 80 | 70 | " | 30 | 150 | " | " |
| 174 | 82 | 85 | " | 15 | 171 | " | yes |
| 175 | " | 80 | " | 20 | 164 | " | no |
| 176 | 84 | " | " | " | " | " | " |
| 177 | 86 | 70 | 4 | 30 | 150 | " | yes |
| 178 | " | 60 | " | 40 | 136 | " | no |
| 179 | 88 | 80 | " | 20 | 164 | " | " |
| 180 | " | 75 | " | 25 | 157 | " | " |
| 181 | 90 | 80 | " | 20 | 164 | 850 | " |
| 182 | " | 75 | " | 25 | 157 | " | " |
| 183 | 92 | 80 | " | 20 | 164 | " | " |
| 184 | 94 | 80 | 5 | 20 | 163 | " | yes |
| 185 | " | 75 | " | 25 | 156 | " | no |
| 186 | 96 | 80 | " | 20 | 163 | " | " |
| 187 | 97 | 80 | " | 20 | 163 | " | " |
| 188 | 98 | 80 | " | 20 | 163 | " | " |
| 189 | 100 | 80 | 7 | 20 | 166 | " | " |
| 190 | " | 85 | " | 15 | 172 | " | yes |
| 191 | 101 | 80 | " | 20 | 166 | " | no |
| 192 | 102 | 75 | 12 | 25 | 155 | " | yes |
| 193 | " | 70 | " | 30 | 147 | " | no |
| 194 | 104 | 75 | " | 25 | 155 | 800 | " |
| 195 | " | 80 | " | 20 | 162 | " | yes |
| 196 | 105 | 80 | " | 20 | 162 | " | no |
| 197 | 106 | 80 | " | 20 | 162 | " | " |
| 198 | " | 75 | " | 25 | 155 | " | " |
| 199 | 107 | 80 | " | 20 | 162 | " | " |
| 200 | 108 | 70 | " | 30 | 147 | " | yes |
| 201 | " | 65 | " | 35 | 139 | " | no |

TABLE 7

Compositions of Conductive Materials Consisting of Copper and Low-Temperature Softening Glass

| No. | Ceramic material No. | Electrically conductive material | | | Coefficient of thermal expansion ($10^{-7}$/°C.) | Sintering temperature (°C.) | Presence of cracks |
|---|---|---|---|---|---|---|---|
| | | Blending ratio (% by weight) | | | | | |
| | | Quantity of copper | Low-temperature softening glass No. | Quantity | | | |
| 202 | 78 | 90 | 2 | 10 | 161 | 800 | yes |
| 203 | " | 85 | " | 15 | 154 | " | no |
| 204 | 80 | 80 | " | 20 | 148 | " | " |
| 205 | 82 | 90 | " | 10 | 161 | " | " |
| 206 | " | 85 | " | 15 | 154 | " | " |
| 207 | 84 | 90 | " | 10 | 161 | " | " |

TABLE 7-continued

Compositions of Conductive Materials Consisting of Copper and Low-Temperature Softening Glass

| | | Electrically conductive material | | | | | |
|---|---|---|---|---|---|---|---|
| | Ceramic | Blending ratio (% by weight) | | | Coefficient of | Sintering | |
| No. | material No. | Quantity of copper | Low-temperature softening glass No. | Quantity | thermal expansion ($10^{-7}$/°C.) | temperature (°C.) | Presence of cracks |
| 208 | 86 | 80 | 4 | 20 | 148 | " | yes |
| 209 | " | 70 | " | 30 | 138 | " | no |
| 210 | 88 | 90 | " | 10 | 161 | " | " |
| 211 | " | 85 | " | 15 | 155 | " | " |
| 212 | 90 | 90 | " | 10 | 161 | 850 | " |
| 213 | " | 80 | " | 20 | 148 | " | " |
| 214 | 92 | 90 | " | 10 | 161 | " | " |
| 215 | 94 | 90 | 5 | 10 | 160 | " | yes |
| 216 | " | 80 | " | 20 | 147 | " | no |
| 217 | 96 | 90 | " | 10 | 160 | " | " |
| 218 | 97 | 95 | " | 5 | 167 | " | " |
| 219 | 98 | 90 | " | 10 | 160 | " | " |
| 220 | 100 | 90 | 7 | 10 | 161 | " | " |
| 221 | " | 85 | " | 15 | 155 | " | " |
| 222 | 101 | 95 | " | 5 | 167 | " | " |
| 223 | 102 | 85 | 12 | 15 | 153 | 800 | " |
| 224 | " | 80 | " | 20 | 146 | " | " |
| 225 | 104 | 90 | " | 10 | 160 | " | " |
| 226 | " | 80 | " | 20 | 146 | " | " |
| 227 | 105 | 90 | " | 10 | 160 | " | " |
| 228 | 106 | 90 | " | 10 | 160 | " | " |
| 229 | " | 95 | " | 5 | 166 | " | yes |
| 230 | 107 | 90 | " | 10 | 160 | " | no |
| 231 | 108 | 80 | " | 20 | 146 | " | yes |
| 232 | " | 75 | " | 25 | 140 | " | no |

Silicon oxide exists in a variety of forms such as quartz, quartz glass, cristobalite, tridymite, etc., which have different coefficients of thermal expansion. A desired coefficient of thermal expansion can be obtained by using these various silicon oxides as fillers.

EXAMPLE 1

100 parts of each of starting ceramic materials were mixed at the mixture ratios shown in Table 2 in a ball mill for 24 hours. 6.0 parts of a polyvinyl butyral resin, 2.4 parts dioctyl phthalate, 23.0 parts trichloroethylene, 9.0 parts perchloroethylene and 6.0 parts butyl alcohol were introduced into the ball mill and mixed therein for 10 hours. The mixtures assumed a slurry form. The slurries were continuously applied at a thickness of 0.25 mm onto polyester film using a doctor blade. The sheets were heated at a maximum temperature of 120° C. so that solvents therein were evaporated. Green sheets were thus obtained, these were cut into pieces of a predetermined shape. Through holes 0.1 mm in diameter were formed by a punching method at a pitch of between 0.2 to 2.0 mm, and the through holes were filled with an electrically conductive paste of silver by a printing method to form through hole conductors for connecting the patterned electrically conductive layers. Wiring was printed onto the surfaces of the sheets. Six green sheets on which silver conductors had been printed were stacked with the aid of guide holes, and were stuck together at 120° C. under a pressure of 10 kg/cm².

The stacked green sheets were introduced into a furnace and were fired in an atmosphere of air. The firing was effected at the sintering temperatures shown in Table 2 for about 30 minutes.

Ceramic circuit boards with six electrically conductive layers was obtained through these steps. Since silver was used as the electrically conductive material for the circuit boards, the resistivity of the electrically conductive material was 0.4 ohm/cm at a wiring width of 80 μm.

When the pitch of the through holes was more than 0.5 mm, cracks developed to some extent in the vicinities of the through holes. This resulted from the difference between the coefficients of thermal expansion of silver used as the electrically conductive material, and the ceramic material. When the pitch of the through holes was less than 0.5 mm, no cracks developed at all. It was found that even when there was a large difference between the coefficients of thermal expansion, the development of cracks could be eliminated by reducing the pitch of through holes, i.e., by forming the wiring at a high density. This result could only be obtained when the coefficient of thermal expansion of the ceramic material was less than the coefficient of thermal expansion of the electrically conductive material.

EXAMPLE 2

100 parts of each of starting ceramic materials were mixed at the mixture ratios shown in Table 2 in a ball mill for 24 hours, in the same manner as in Example 1. 5.9 parts methacrylic acid resin, 2.4 parts dioctyl phthalate, 23.0 parts ethyl acetate, 9.0 parts butyl acetate and 6.0 parts butyl alcohol were introduced into the ball mill and mixed therein for 10 hours. The mixtures assumed a slurry form. The slurries were continuously applied at a thickness of 0.25 mm onto polyester film using a doctor blade. The sheets were heated at a maximum temperature of 120° C. so that solvents therein were evaporated. Green sheets were thus obtained, these were cut into pieces of a predetermined shape. Through holes 0.1 mm in diameter were formed by a punching method at a pitch of between 0.2 to 2.0 mm, and six green sheets on which an electrically conductive paste of copper had been formed were stacked with the aid of guide holes, and were stuck together at 120° C. under a pressure of 15 kg/cm².

The stacked green sheets were introduced into a furnace and were fired in a nitrogen atmosphere containing between 3 to 7% hydrogen. Small amounts of water vapor were introduced into the atmosphere to promote the thermal decomposition of the organic binders. Firing was effected at the same temperatures as those in Example 1.

Ceramic circuit boards with six electrically conductive layers were obtained through these steps. Since copper was used as the electrically conductive material for the ceramic circuit boards, the resistivity of the wiring was 0.4 ohm/cm at a wiring width of 80 μm.

When the pitch of the through holes was more than 0.6 mm, cracks developed to some extent in the vicinities of the through holes, as in Example 1. This was caused by the difference between the coefficients of thermal expansion of the copper used as the electrically conductive material, and the ceramic material. When the pitch of the through holes was less than 0.6 mm, no cracks developed at all, even when there was a large difference between the coefficients of thermal expansion. It was found that the development of cracks could be eliminated by reducing the pitch of the through holes, i.e., by forming the wiring at a high density.

EXAMPLE 3

100 parts of each of starting ceramic materials were mixed at the mixture ratios shown in Table 3 in a ball mill for 24 hours. 6.0 parts of polyvinyl butyral resin, 2.4 parts dioctyl phthalate, 23.0 parts trichloroethylene, 9.0 parts perchloroethylene and 6.0 parts butyl alcohol were introduced into the ball mill and mixed therein for 10 hours. The mixtures assumed a slurry form. The slurries were continuously applied at a thickness of 0.25 mm onto polyester film using a doctor blade. The sheets were heated at a maximum temperature of 120° C. to evaporate the solvents therein. Green sheets were thus obtained, these were cut into pieces of a predetermined shape. Through holes with a predetermined diameter and pitch were formed therein by a punching method. Electrically conductive pastes were prepared at the mixture ratios shown in Table 4, and through hole conductors were formed in the through holes by a printing method, to connect the patterned electrically conductive layers, which were also printed on the surfaces of the sheets. Six green sheets on which silver or gold had been printed were stacked with the aid of guide holes, and were stuck together at 120° C. under a pressure of 10 kg/cm².

The stacked green sheets were introduced into a furance and were fired in an atmosphere of air. The firing was effected at the sintering temperature shown in Table 3 for about 30 minutes.

Ceramic circuit boards with six electrically conductive layers were obtained through these steps.

Cracks developed to some extent at the boundaries of the through holes in the ceramic layers when the difference between the coefficients of thermal expansion of the ceramic material and the electrically conductive material was more than $100 \times 10^{-7}/°C$. However, no cracks developed at all when the coefficient of thermal expansion of the electrically conductive material was so low that the difference between it and the coefficient of expansion of the ceramic material was less than $100 \times 10^{-7}/°C$.

EXAMPLE 4

100 parts of each starting ceramic materials were mixed at the mixture ratios shown in Table 3 in a ball mill for 24 hours, in the same manner as in Example 1. 5.9 parts methacrylic acid resin, 2.4 parts dioctyl phthalate, 23.0 parts ethyl acetate, 9.0 parts butyl acetate and 6.0 parts butyl alcohol were introduced into the ball mill and mixed therein for 10 hours. The mixtures assumed a slurry form. The slurries were continuously applied at a thickness of 0.25 mm onto polyester film using a doctor blade. The sheets were heated at a maximum temperature of 120° C. to evaporate the solvents therein. Green sheets were thus formed, these were then cut into pieces of a predetermined shape, and with a predetermined diameter and pitch through holes were formed therein by a punching method. Electrically conductive pastes were prepared at the mixture ratios shown in Table 5, and through hole conductors were formed in the through holes by a printing method to connect the patterned electrically conductive layers, which were also printed onto the surfaces of the sheets. Six green sheets on which copper had been printed were stacked with the aid of guide holes, and were stuck together at 120° C. under a pressure of 10 kg/cm².

The stacked green sheets were introduced into a furnace and were fired in a nitrogen atmosphere containing between 3 to 7% hydrogen. Small quantities of water vapor were introduced into the atmosphere to promote the thermal decomposition of the organic binders. The firing (sintering) was effected at the temperatures shown in Table 3.

Ceramic circuit board with six electrically conductive layers were obtained through these steps.

Cracks developed to some extent at the boundaries of the through holes in the ceramic layer when the difference between the coefficients of thermal expansion of the ceramic material and the electrically conductive material was more than $100 \times 10^{-7}/°C$. However, no cracks developed at all when the coefficient of thermal expansion of the electrically conductive material was so low that the difference between it and the coefficient of thermal expansion of the ceramic material was less than $100 \times 10^{-7}/°C$.

EXAMPLE 5

Ceramic circuit boards were obtained according to the same procedure as that of Example 3, with the exception of using, as the electrically conductive material, a silver-type paste containing the same low-temperature softening glass as that used for the ceramic material.

Table 6 shows the blending ratios of the electrically conductive materials, the coefficients of thermal expansion, and the presence of cracks in the vicinities of the through holes when these electrically conductive materials were used.

Cracks developed to some extent at the boundaries of the through holes in the ceramic layer when the difference between the coefficients of thermal expansion of the ceramic material and the electrically conductive material was more than $100 \times 10^{-7}/°C$. However, no cracks developed at all when the coefficient of thermal expansion of the electrically conductive material was so low that the difference between it and the coefficient of thermal expansion of the ceramic material was less than $100 \times 10^{-7}/°C$.

EXAMPLE 6

Ceramic circuit boards were obtained according to the same procedure as that of Example 4, with the exception of using, as the electrically conductive material, a copper-type paste containing the same low-temperature softening glass as that used for the ceramic material.

Table 7 shows the blending ratios of the electrically conductive materials, the coefficients of thermal expansion, and the presence of cracks in the vicinities of the through holes when these electrically conductive materials were used.

Cracks developed to some extent at the boundaries of the through holes in the ceramic layer when the difference between the coefficients of thermal expansion of the ceramic material and the electrically conductive material was more than $100 \times 10^{-7}/°C$. However, no cracks developed at all when the coefficient of thermal expansion of the electrically conductive material was so low that the difference between it and the coefficient of thermal expansion of the ceramic material was less than $100 \times 10^{-7}/°C$.

What is claimed is:

1. A multilayered ceramic circuit board which comprises a plurality of glass-containing ceramic layers integrally bonded, each having a patterned electrically conductive layer supported thereon and through holes filled with electrical conductors for connecting the patterned electrically conductive layers to form a predetermined wiring circuit, wherein the glass-containing ceramic layers consist essentially of a low temperature softening glass with a softening point of 600° C. to 850° C. and a dielectric constant of less than 5.7, and the patterned electrically conductive layers and through holes electrical conductors consist essentially of a metal with a low resistivity and a glass material having a glass composition consisting essentially of $SiO_2$ in an amount of 5 to 90% by weight, $B_2O_3$ in an amount of 10 to 70% by weight and a refractory additive in an amount of 1 to 55% by weight, and having a softening point of 600° C.-850° C., the pitch of the through holes formed in the ceramic layers being less than 0.5 mm, whereby cracks in the vicinities of the through holes can be prevented.

2. A multilayered ceramic circuit board according to claim 1, wherein the glass composition consists essentially of $SiO_2$ in an amount of 10 to 80%, $B_2O_3$ in an amount of 15 to 65%, $Al_2O_3$ in an amount of 3 to 27%, up to 15% of MgO, up to 35% of BaO, up to 45% of $AlPO_4$, up to 18% of $MgF_2$, up to 10% of $K_2O$, up to 5% of $Na_2O$, and up to 17% of $Bi_2O_3$.

3. A multilayered ceramic circuit board according to claim 2, wherein the glass composition consists essentially of $SiO_2$ in an amount of 30 to 50%, $B_2O_3$ in an amount of 20 to 50%, $Al_2O_3$ in an amount of 5 to 15%, up to 10% of MgO, up to 20% of BaO, up to 30% of $AlPO_4$, up to 10% of $MgF_2$, up to 10% of $K_2O$, up to 5% of $Na_2O$, and up to 10% of $Bi_2O_3$, and has a softening point lower than 850° C.

4. A multilayered ceramic circuit board according to claim 3, wherein the glass composition consists essentially of 30 to 50% of $SiO_2$, 10 to 40% of $B_2O_3$, 5 to 15% of $Al_2O_3$, 2 to 10% of at least one of BaO and MgO, and up to 5% of at least one of $Na_2O$ and $K_2O$.

5. The multilayered ceramic circuit board according to claim 1, wherein said glass composition is the same as the glass composition for forming said glass-containing ceramic layers.

6. A multilayered ceramic circuit board formed of a plurality of unit ceramic circuit boards, each including a glass-containing ceramic layer, a patterned electrically conductive layer and through hole electrical conductors for connecting the patterned electrically conductive layers of the respective unit ceramic circuit boards to form a predetermined wiring circuit, wherein the glass-containing ceramic layers consist essentially of a low temperature softening glass with a softening point of 600° C. to 850° C. and a $SiO_2$ containing additive and have a dielectric constant of less than 5.7 and the patterned electrically conductive layers and the through hole electrical conductors consist essentially of a metal with a low resistivity and a $SiO_2$ containing filler, the pitch of the through holes formed in the glass-containing ceramic layers being less than 0.5 mm, whereby cracks in the vicinities of the through holes can be prevented.

7. A multilayered ceramic circuit board according to claim 6, wherein the $SiO_2$ containing filler has a linear thermal expansion coefficient of less than $100 \times 10^{-7}/°C$. over the temperature of 25° to 850° C.

8. The multilayered ceramic circuit board according to claim 6, wherein said metal is selected from the group consisting of silver, copper, gold, their alloys and mixtures thereof.

9. The multilayered ceramic circuit board according to claim 6, wherein said glass containing ceramic layers have a coefficient of thermal expansion of between 30 to $70 \times 10^{-7}/°C$.

10. A multilayered ceramic circuit board according to claim 6, wherein the $SiO_2$ containing filler is selected from the group consisting of quartz, quartz glass, cristoballite, tridymite, and mixtures thereof.

11. A multilayered ceramic circuit board formed of a plurality of glass-containing ceramic layers integrally bonded, each glass-containing ceramic layer having a patterned electrically conductive layer supported thereon and through holes filled with electrical conductors for connecting the patterned electrically conductive layers to form a predetermined wiring circuit, wherein a material for the glass-containing ceramic layers consists essentially of a low temperature softening glass with a softening point of 600° C. to 850° C. and a $SiO_2$ containing additive and has a dielectric constant of less than 5.7 and an electrically conductive material for the patterned electrically conductive layers and the electrical conductors for the through holes has a coefficient of thermal expansion larger than that of the ceramic material, and further the materials for the patterned electrically conductive layers and the electrical conductors for the through holes, and for the glass-containing ceramic layers, are selected so that the coefficients of thermal expansion of the patterned electrically conductive layers and the electrical conductors for the through holes, and the glass-containing ceramic layers, differ by less than $100 \times 10^{-7}/°C$., the pitch of the through holes formed in the glass-containing ceramic layers being less than 0.5 mm, whereby cracks in the vicinities of the through holes can be prevented.

12. A multilayered ceramic circuit board formed of a plurality of glass-containing ceramic layers integrally bonded, each glass-containing ceramic layer having a patterned electrically conductive layer supported thereon and through holes filled with electrical conductors for connecting the patterned electrically conductive layers to form a predetermined wiring circuit, wherein a material for the glass-containing ceramic layer consists essentially of a low temperature softening glass with a softening point of 600° C. to 850° C. and a SiO$_2$ containing additive and has a dielectric constant of less than 5.7, and wherein an electrically conductive material for the patterned electrically conductive layers and the electrical conductors for the through holes has a coefficient of thermal expansion larger than that of the glass-containing ceramic layers, and further wherein the pitch of the through holes formed in the glass-containing ceramic layers is selected to be less than 0.5 mm.

* * * * *